United States Patent
Oh et al.

(10) Patent No.: US 7,212,560 B2
(45) Date of Patent: May 1, 2007

(54) TUNABLE EXTERNAL CAVITY LASER DIODE USING VARIABLE OPTICAL DEFLECTOR

(75) Inventors: Kwang Ryong Oh, Daejeon (KR); Oh Kee Kwon, Daejeon (KR); Kang Ho Kim, Daejeon (KR); Jong Hoi Kim, Daejeon (KR); Hyun Soo Kim, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 303 days.

(21) Appl. No.: 11/029,784

(22) Filed: Dec. 21, 2004

(65) Prior Publication Data

US 2006/0029119 A1 Feb. 9, 2006

(30) Foreign Application Priority Data

Aug. 9, 2004 (KR) .................... 10-2004-0062352

(51) Int. Cl.
*H01S 3/08* (2006.01)
*H01S 3/10* (2006.01)

(52) U.S. Cl. .................... 372/98; 372/20; 372/102
(58) Field of Classification Search ............ 372/20, 372/29.022, 92–93, 98–102
See application file for complete search history.

(56) References Cited

U.S. PATENT DOCUMENTS

| | | | | |
|---|---|---|---|---|
| 5,371,586 | A * | 12/1994 | Chau | 356/301 |
| 5,594,744 | A * | 1/1997 | Lefevre et al. | 372/20 |
| 5,862,162 | A * | 1/1999 | Maeda | 372/20 |
| 6,018,535 | A * | 1/2000 | Maeda | 372/20 |
| 6,026,100 | A | 2/2000 | Maeda | |
| 6,049,554 | A * | 4/2000 | Lang et al. | 372/20 |
| 6,091,755 | A * | 7/2000 | Sanders et al. | 372/92 |
| 6,118,802 | A * | 9/2000 | Sanders et al. | 372/50.1 |
| 6,507,597 | B1 * | 1/2003 | Graindorge et al. | 372/102 |

(Continued)

OTHER PUBLICATIONS

"External-cavity diode laser using a grazing-incidence diffraction grating", K.C. Harvey, et al., 1991 Optical Society of America, vol. 16, No. 12, pp. 910-912.

(Continued)

*Primary Examiner*—Minsun Oh Harvey
*Assistant Examiner*—Phillip Nguyen
(74) *Attorney, Agent, or Firm*—Blakely Sokoloff Taylor & Zafman

(57) ABSTRACT

Provided is a tunable external cavity laser diode using a variable optical deflector wherein the variable optical deflector, in which a refractive index varies according to an electrical signal, is arranged in a triangular shape between a concave diffraction grating and a reflective mirror. Since a resonant frequency is changed using the electrical signal rather than the mechanical movement, the stable operation and continuous high-speed tenability may be enabled. In addition, when the tunable external cavity laser diode according to the present invention is implemented in an InP/InGaAsP/InP slab waveguide, a variable time determined by the carrier lifetime may be reduced to several nanoseconds or less, the miniaturization is enabled, and the manufacturing costs are significantly reduced due to the process simplification. Moreover, when the concave diffraction grating is designed based on a silica (or polymer) based slab waveguide, the fabrication may be performed even by a lithography process having low resolution, thereby enhancing reproducibility and uniformity of the diffraction grating, and accordingly reducing the manufacturing costs.

11 Claims, 4 Drawing Sheets

U.S. PATENT DOCUMENTS

| | | | |
|---|---|---|---|
| 6,560,249 B1* | 5/2003 | Lefevre et al. | 372/20 |
| 6,687,275 B2* | 2/2004 | Lin | 372/42 |
| 6,856,632 B1* | 2/2005 | Heanue et al. | 372/20 |
| 6,959,024 B2* | 10/2005 | Paldus et al. | 372/20 |
| 7,065,108 B2* | 6/2006 | Park et al. | 372/20 |
| 2003/0112838 A1* | 6/2003 | Oh et al. | 372/20 |
| 2003/0161361 A1* | 8/2003 | Paldus et al. | 372/20 |
| 2004/0114644 A1* | 6/2004 | Kwon et al. | 372/20 |
| 2005/0286570 A1* | 12/2005 | Xiang | 372/20 |

OTHER PUBLICATIONS

"Widely tunable external cavity diode laser based on a MEMS electrostatic rotary actuator", J. Berger, et al., 3 pages.

* cited by examiner

TUNABLE EXTERNAL CAVITY LASER DIODE USING VARIABLE OPTICAL DEFLECTOR

CROSS-REFERENCE TO RELATED APPLICATION

This application claims priority to and the benefit of Korean Patent Application No. 2004-62352 filed Aug. 9, 2004, the disclosure of which is incorporated herein by reference in its entirety.

BACKGROUND

1. Field of the Invention

The present invention relates to a tunable external cavity laser diode and, more specifically, to a tunable external cavity laser diode using a variable optical deflector in which a refractive index varies according to an electrical signal.

2. Discussion of Related Art

In general, an external cavity is used to convert light of a single wavelength emitted from a light source such as a laser diode having a predetermined bandwidth to light of a specific wavelength. A Littman-Metcalf configuration and a Littrow configuration are typical external cavity configurations, and the method of converting into the light of a specific wavelength is applied to dye laser technology or optical characteristic measuring technology widely used in researches of spectroscopy.

FIG. 1 is a structure diagram illustrating a conventional Littman-Metcalf external cavity.

The Littman-Metcalf external cavity is composed of a lens 11 parallelizing a beam generated from a laser diode 10 having a wide wavelength range, a diffraction grating 12 for diffracting the parallel beam, and a reflective mirror 13 for reflecting the diffracted beam.

When the beam is generated from the laser diode 10, the beam is gathered in parallel through the lens 11, and the parallel beam is diffracted toward the reflective mirror 13 by the diffraction grating 12. An angle of the reflective mirror 13 facing the diffraction grating 12 is adjusted by an apparatus (not shown), so that only the light of a specific wavelength, which is incident perpendicular to the reflective mirror 13, among the incident light may be reflected to the diffracted grating 12 by the reflective mirror 13. The beam returned to the diffraction grating 12 is diffracted again by the diffraction grating 12 and goes back to the laser diode 10 through the lens 11.

While the beam having a predetermined wavelength 15a is incident perpendicular to the reflective mirror 13 to be reflected to the diffraction grating 12, When the reflective mirror 13 is rotated to be located at a reflective mirror 13', the beam having another wavelength 15b is incident perpendicular to the reflective mirror 13' to be reflected to the diffraction grating 12. Therefore, the wavelength of the beam returning to the laser diode 10 varies according to an arrangement angle of the reflective mirror 13. With this principle, the wavelength varies according to an angle of the reflective mirror 13.

As illustrated above, the Littman-Metcalf external cavity laser diode varies a wavelength by adjusting the angle of the reflective mirror, while the Littrow external cavity laser diode varies a wavelength by adjusting an angle of the diffraction grating.

FIG. 2 is a structure diagram illustrating a conventional Littrow external cavity.

The Littrow external cavity has a similar configuration to the Littman-Metcalf external cavity, but changes a wavelength not by adjusting an angle of a reflective mirror but by adjusting an angle of a diffraction grating 22.

When a beam is generated from a laser diode 20, the beam is gathered in parallel through a lens 21, and a beam having a specific wavelength among the beams gathered in parallel is diffracted according to an angle of the diffraction angle 22 and goes back to the laser diode 20 through the lens 21. In other words, since the wavelength of the beam returning to the laser diode varies according to an arrangement angle of the diffraction grating 22, the wavelength may be varied.

As described above, in order to select the beam having a specific wavelength, the conventional Littman-Metcalf or Littrow external cavity tunable laser rotates the reflective mirror or the diffraction grating mechanically to adjust an angle. Therefore, since the reflective mirror or the diffraction grating should be finely rotated in a mechanical sense, a high-precision rotating apparatus is required to select the specific wavelength. This may result in degraded laser stability, a larger size, a slow variable speed and the increased manufacturing cost.

While the afore-mentioned conventional technologies have advantages in terms of the arrangement and performance, they also have problems. In other words, the conventional technologies require a mechanical movement, have a narrow wavelength tunable range, and are difficult to reduce the module size. Therefore, there is a need of a new method of fabricating a light source, which may be applied to spectroscopy that requires a tunable wavelength and a WDM optical communication system that requires a wide range of the tunable wavelength, has no movement of a structure, facilitates miniaturization, and has a fast variable speed.

SUMMARY OF THE INVENTION

The present invention is directed to a tunable external cavity laser diode using a variable optical deflector capable of changing a resonant frequency stably by using an electrical signal without any mechanical movement.

The present invention is also directed to a tunable external cavity laser diode using a variable optical deflector, in which high speed tunability may be obtained continuously.

One aspect of the present invention is to provide a tunable external cavity laser diode using a variable optical deflector, including: a semiconductor optical amplifier generating beams having several wavelengths; a passive waveguide outputting the beams to be inclined and having a cross section according to a Wadsworth grating system such that diffracted beams propagate in parallel; a slab waveguide spreading in parallel the beams outputted from the passive waveguide as well as guiding the beams in a vertically confined manner; a concave diffraction grating having a concave light incident plane and diffracting the propagating beams from the slab waveguide to be parallel based on a wavelength; a reflective mirror formed on one side of the slab waveguide to reflect the parallel beams diffracted by the concave diffraction grating; and a variable optical deflector located between the concave diffraction grating and the reflective mirror, and having reflectivity varying according to an electrical signal so that a beam having a specific wavelength among the beams diffracted by the concave diffraction grating is incident perpendicular to the reflective mirror, wherein the semiconductor optical amplifier, the diffraction grating, and the variable optical deflector are integrated into the slab waveguide.

The semiconductor optical amplifier, the diffraction grating, the variable optical deflector, and the slab waveguide may be made of an InP-based or GaAs-based semiconductor substrate.

The diffraction grating, the variable optical deflector and the slab waveguide may be made of a silica-based or polymer-based substrate, and an InP-based or GaAs-based semiconductor optical amplifier may be hybridly integrated on the silica-based or polymer-based substrate.

A cylindrical lens may be interposed between the silica-based or polymer-based substrate and the semiconductor optical amplifier.

An antireflective thin film may be deposited on the silica-based or polymer-based substrate at a portion where the slab waveguide and the semiconductor optical amplifier are in contact with each other.

The variable optical deflector may be formed of a p/n junction having a triangular shape at a predetermined portion of the slab waveguide and the electrical signal is applied to the p/n junction.

The semiconductor optical amplifier, the variable optical deflector, and the reflective mirror may be formed in the InP-based or GaAs-based slab waveguide, the diffraction grating may be formed in the silica-based or polymer-based slab waveguide, and the InP-based or GaAs-based slab waveguide and the silica-based or polymer-based slab waveguide may be hybridly integrated.

A cylindrical lens may be interposed between the InP-based or GaAs-based slab waveguide and the silica-based or polymer-based slab waveguide for optical coupling.

An antireflective layer may be deposited on an interface between the InP-based or GaAs-based slab waveguide and the silica-based or polymer-based slab waveguide to minimize reflectivity.

The variable optical deflector may be formed of a p/n junction having a triangular shape at a predetermined portion of the InP-based or GaAs-based slab waveguide, and the electrical signal may be applied to the p/n junction.

The variable optical deflectors may be arranged in a multi stage structure to refract the beams at least more than once.

BRIEF DESCRIPTION OF THE DRAWINGS

The foregoing and other objects, features and advantages of the invention will be apparent from the more particular description of a preferred embodiment of the invention, as illustrated in the accompanying drawing. The drawing is not necessarily to scale, emphasis instead being placed upon illustrating the principles of the invention.

DETAILED DESCRIPTION OF PREFERRED EMBODIMENTS

Exemplary embodiments of the present invention will now be described in detail with reference to the accompanying drawings. Those skilled in the art will be fully appreciated from the following document and a variety of modification may be made. However, the scope of the present invention is not limited to the following description.

Figure 1:
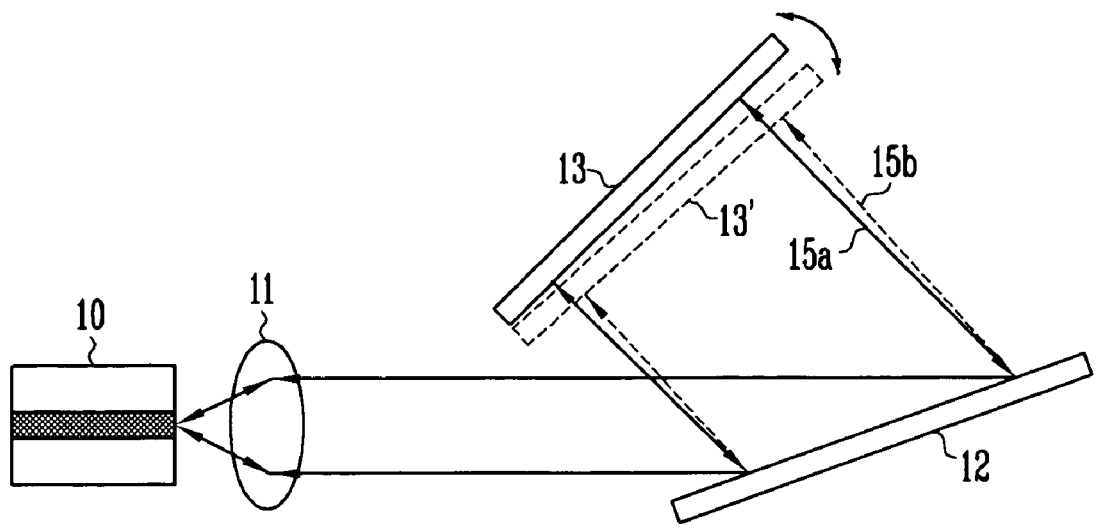
FIG. 1 is a structure diagram illustrating a conventional Littman-Metcalf external cavity.
Figure 2:
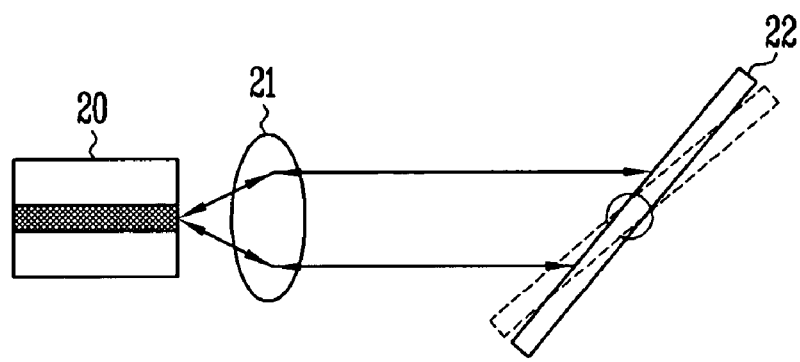
FIG. 2 is a structure diagram illustrating a conventional Littrow external cavity.
Figure 3:
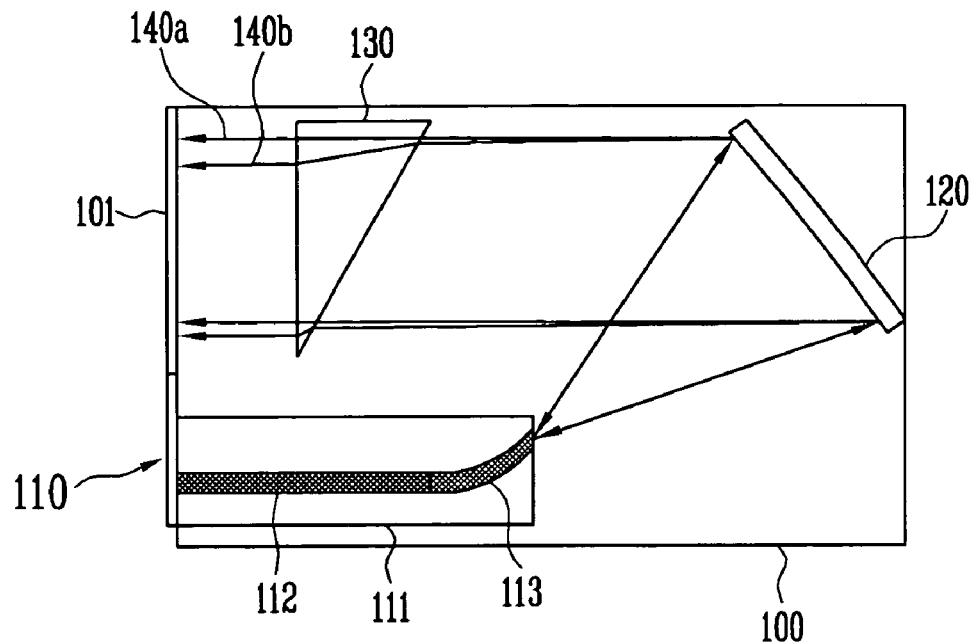
FIG. 3 is a structure diagram illustrating a tunable external cavity laser diode using a variable optical deflector according to a first embodiment of the present invention.

FIG. 3 is a structure diagram illustrating a tunable external cavity laser diode using a variable optical deflector according to a first embodiment of the present invention.

A semiconductor optical amplifier 112, a concave diffraction grating 120, and a variable optical deflector 130 are integrated into an InP (or GaAs) based slab waveguide 100.

The InP (or GaAs) based slab waveguide 100, which is made of, for example, an InP (or GaAs) based semiconductor substrate, serves to guide a beam outputted from the semiconductor optical amplifier 112 and a passive waveguide 113 by spreading in parallel as well as by vertically confining the beam. In addition, a cross section of the InP (or GaAs) based slab waveguide 100 serves as a reflective mirror 101 reflecting the parallel beam diffracted by the diffraction grating 120.

The semiconductor optical amplifier 112, which is a medium having a gain of a light signal and is also a light source that generates beams of several wavelengths, has a similar structure to a Fabry-Perot semiconductor laser. The passive waveguide 113 is in contact with an end of the semiconductor optical amplifier 112 to output the beam generated from the semiconductor optical amplifier 112 to be inclined by a predetermined angle. The passive waveguide 113 is preferably formed in a curved shape having any radius of the curvature and its longitudinal section is arranged according to a Wadsworth grating configuration.

The concave diffraction grating 120 has a light incident plane formed in a concave shape, and serves to diffract the beam propagating from the InP (or GaAs) based slab waveguide 100 and to vary in parallel a direction of the diffracted beam according to the wavelength The variable optical deflector 130 has a triangular shape, and is located between the concave diffraction grating 120 and the reflective mirror 101. Here, the position of the variable optical deflector 130 is set such that every beam diffracted from the concave diffraction grating 120 passes through the variable optical deflector 130. The variable optical deflector 130 make a beam having a specific wavelength among the beams 140a and 140b diffracted from the concave diffraction grating 120 incident perpendicular to the reflective mirror 101 formed on the cross section of the InP (or GaAs) based slab waveguide 100. The variable optical deflector 130 may be formed of a p/n junction having a triangular shape in the substrate plane of the InP (or GaAs) based slab waveguide 100 made of a material capable of forming the slab waveguide 100, such as a III-IV compound.

The beams 140a and 140b diffracted from the concave diffraction grating 120 to the reflective mirror 101 passes through the variable optical deflector 130 having a triangular shape and change directions due to a difference of the refractive indexes, which is Snell's law. In other words, when current or voltage is applied to the p/n junction of the variable optical deflector 130, the refractive index is changed due to a photoelectric effect or a change of carrier density in a slab waveguide layer of the variable optical deflector 130. Therefore, in the case where the beam propagating to the InP (or GaAs) based slab waveguide 100 passes through the p/n junction having a triangular shape, when the voltage or current is applied to the p/n junction, the beam will be refracted.

Operation of the tunable external cavity laser diode using the variable optical deflector according to the first embodiment of the present invention will now be described in detail.

First, the beam generated in the semiconductor optical amplifier 112 propagates to the concave diffraction grating 120 through the passive waveguide 113 having a curved shape and the InP (or GaAs) based slab waveguide 100. Since the longitudinal section of the passive waveguide 113 is located according to a Wadsworth grating system, the diffracted beams 140a and 140b propagate in parallel to the reflective mirror 101. At this time, in the case where an electrical signal is not applied to the variable optical deflector 130 so that it has the same refractive index as the neighboring InP (or GaAs) based slab waveguide 100, there exists a beam having a specific wavelength 140a, which is incident perpendicular to the reflective mirror 101, among the beams 140a and 140b diffracted by the concave diffraction grating 120. The beam 140a is reflected by the reflective mirror 101, and then passes the variable optical deflector 130 again to return to the diffraction grating 120. Next, the beam 140a is diffracted again by the concave diffraction grating 120 to be focused into an end of the passive waveguide 113 to return to the semiconductor optical amplifier 112.

Referring to FIG. 3, when the refractive index of the variable optical deflector 130 is the same as that of the neighboring InP (or GaAs) based slab waveguide 100, the beam 140a is reflected perpendicular to the reflective mirror 101 to return to the semiconductor optical amplifier 112. However, the beam 140b having a different diffraction angle is not reflected perpendicular to the reflective mirror 101 so that it will not return to the semiconductor optical amplifier 112. In other words, there is no resonance in the beam 140b.

Further, when the electrical signal is applied to the variable optical deflector 130 to change the refractive index, only the beam 140b of a specific wavelength is selectively incident perpendicular to the reflective mirror 101 and the reflected beam goes back to the semiconductor optical amplifier 112 to make resonance.

FIG. 3 shows a method of arranging the external cavity laser diode, in which the concave diffraction grating 120 is provided by an etching process on an InP (or GaAs) based semiconductor substrate where the InP (or GaAs) based slab waveguide 100 is formed. In addition, the passive waveguide 113 having a curved shape is formed such that the direction of any selected order of diffracted parallel beam is perpendicular to the cross section of the semiconductor substrate. The p/n junction is formed in a triangular shape between the concave diffraction grating 120 and the reflective mirror 101 in the InP (or GaAs) based slab waveguide 100.

Based on a change of the carrier density in the slab waveguide layer due to the voltage or current applied to the p/n junction, or a change of the refractive index due to a photoelectric effect such as a quantum confined stark effect (QCSE), the beam having a specific wavelength may be refracted perpendicular to the reflective mirror 101. For the slab waveguide 100 made of InP and InGaAsP, it is known that when the carrier concentration is changed as much as $5E10^{18}$ cm$^{-3}$, the refractive index may be changed up to 0.05. Through this method, the semiconductor optical amplifier 112, the concave diffraction grating 120, and the variable optical deflector 130, which are key elements of the external cavity laser diode, may be integrated into one substrate.

Figure 4:
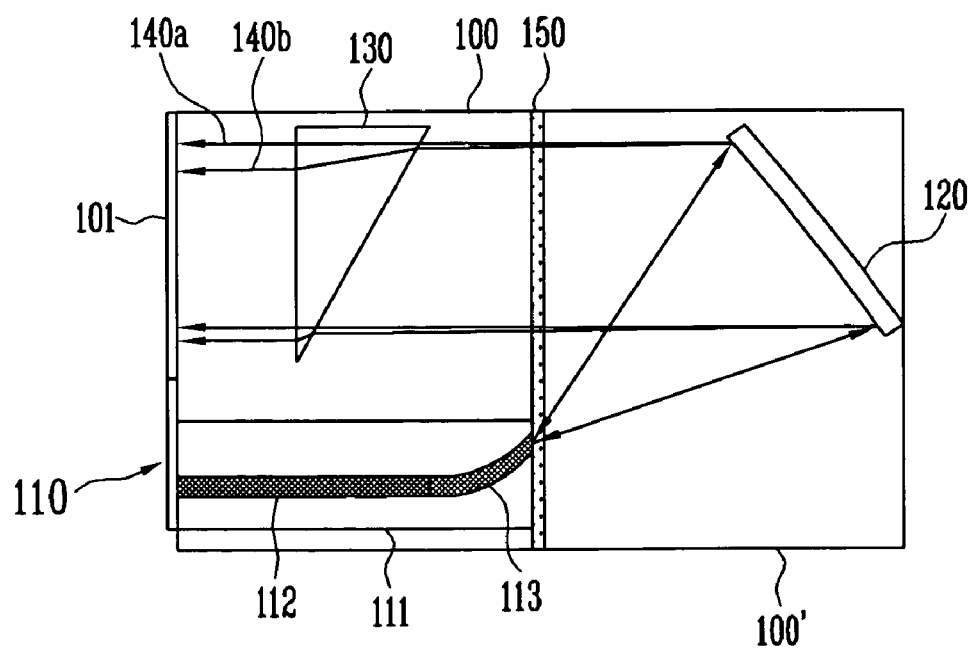
FIG. 4 is a structure diagram illustrating a tunable external cavity laser diode using a variable optical deflector according to a second embodiment of the present invention.

FIG. 4 is a structure diagram illustrating a tunable external cavity laser diode using a variable optical deflector according to a second embodiment of the present invention, where like reference numerals refer to like elements shown in FIG. 3.

Basically, the tunable external cavity laser diode shown in FIG. 4 has the same configuration as that of FIG. 3. However, in the tunable external cavity laser diode of FIG. 3, the InP (or GaAs) based slab waveguide 100, the variable optical deflector 130, and the diffraction grating 120 are formed on the same substrate, while in the tunable external cavity laser diode of FIG. 4, the variable optical deflector 130 is formed in the InP (or GaAs) based slab waveguide 100, the concave diffraction grating 120 is formed in a silica (or polymer) based slab waveguide 100', and these two slab waveguides are hybridly integrated to be connected to each other.

In addition, an antireflective thin film 150 is deposited at an interface between the two slab waveguides 100 and 100' to minimize the reflectivity. The InP (or GaAs) based slab waveguide 100 has an effective refractive index of about 3.3 and the silica (or polymer) based slab waveguide 100' has an effective refractive index of about 1.4. Therefore, for the InP (or GaAs) based slab waveguide 100, a lithography process is required to have 2 or 3 times as fine resolution as that for the silica (or polymer) based slab waveguide 100', in reverse proportion to the effective refractive index, for use in the same order of diffraction component of the diffraction grating 120. Therefore, the silica (or polymer) based slab waveguide is more desirable in terms of processing costs and yield.

Figure 5:
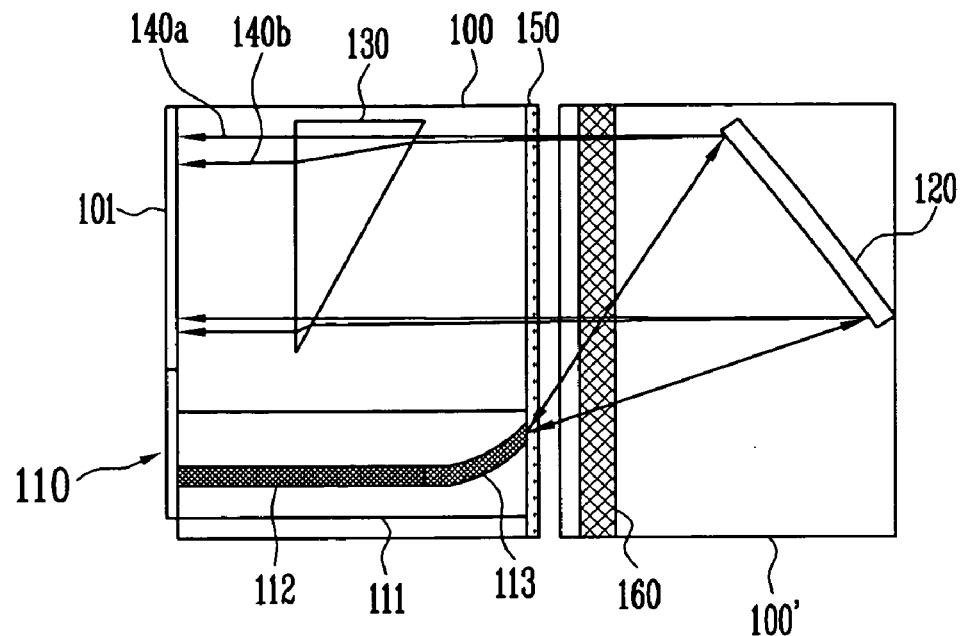
FIG. 5 is a structure diagram illustrating a tunable external cavity laser diode using a variable optical deflector according to a third embodiment of the present invention.

FIG. 5 is a structure diagram illustrating a tunable external cavity laser diode using a variable optical deflector according to a third embodiment of the present invention, in which like reference numerals refer to like elements shown in FIG. 4.

In the tunable external cavity laser diode shown in FIG. 4, the InP (or GaAs) based slab waveguide 100 and the silica (or polymer) based slab waveguide 100' are directly connected for optical coupling. However, in the present embodiment, the two slab waveguides 100 and 100' are not directly connected but a cylindrical lens 160 is interposed between the two slab waveguides 100 and 100' to enhance optical coupling efficiency. In the case where the two slab waveguides 100 and 100' are directly connected, a design allowing the effective refractive index and a waveguide mode to be as close as possible is required to minimize an optical coupling loss. However, in the case where the two slab waveguides 100 and 100' are optically connected using the cylindrical lens 160, an additional waveguide for coupling is not required, and when the positions of the two slab waveguides 100 and 100' are adjusted in consideration of the focal length and numerical aperture (NA) of the cylindrical lens 160, the coupling loss may be minimized.

Figure 6:
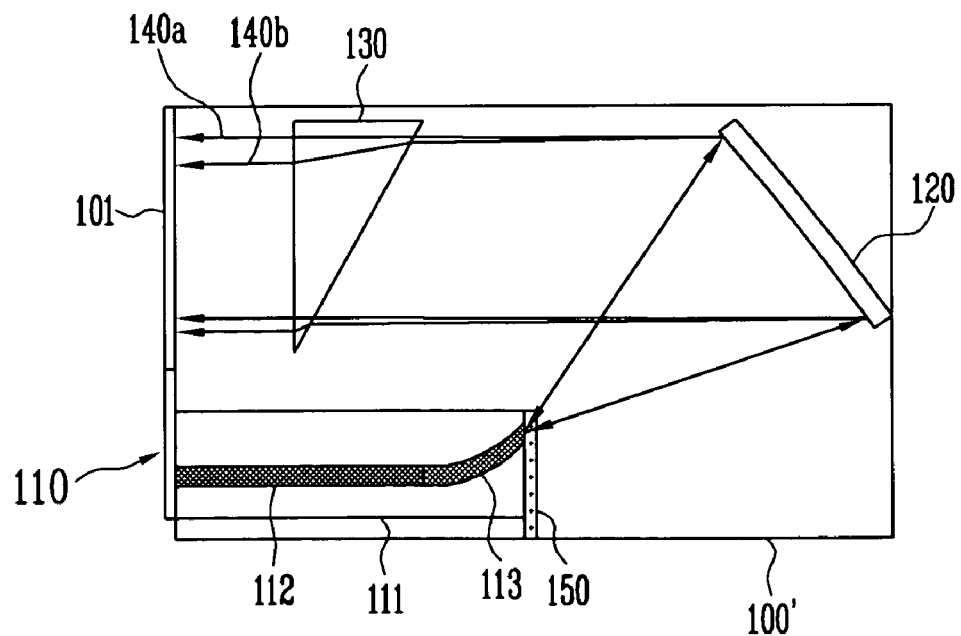
FIG. 6 is a structure diagram illustrating a tunable external cavity laser diode using a variable optical deflector according to a fourth embodiment of the present invention.

FIG. 6 is a structure diagram illustrating a tunable external cavity laser diode using a variable optical deflector according to a fourth embodiment of the present invention, in which like reference numerals refer to like elements shown in FIG. 3.

Basically, the tunable external cavity laser diode of FIG. 6 has the same configuration as that of FIG. 3. However, in the tunable external cavity laser diode of FIG. 3, the InP (or GaAs) based slab waveguide 100, the variable optical deflector 130, and the diffraction grating 120 are formed on the same substrate, while in the tunable external cavity laser diode of FIG. 6, the variable optical deflector 130 and the diffraction grating 120 are formed in the silica (or polymer) based slab waveguide 100, and the semiconductor optical amplifier 112 is directly connect to the silica (or polymer) based slab waveguide 100' through hybrid-integration. Here, an antireflective layer 150 is deposited at an interface between the silica (or polymer) based slab waveguide 100' and the semiconductor optical amplifier 112 to minimize the reflectivity.

According to the present invention where the variable optical deflector 130 is formed in the silica (or polymer) based slab waveguide (100'), the refractive index of the variable optical deflector 130 may be changed using an electrical signal. In addition, the refractive index of the variable optical deflector 130 may also be changed using a temperature change.

Figure 7:
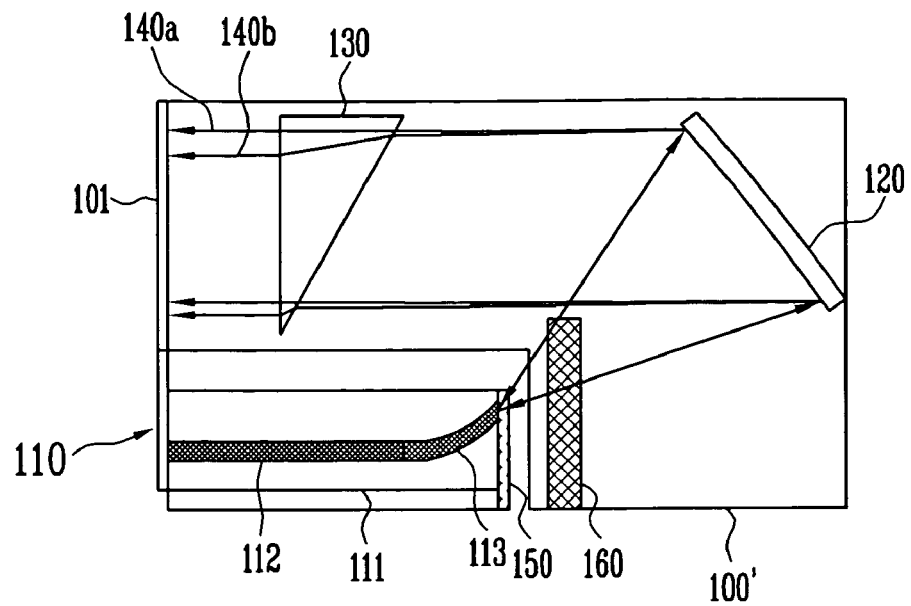
FIG. 7 is a structure diagram illustrating a tunable external cavity laser diode using a variable optical deflector according to a fifth embodiment of the present invention.

FIG. 7 is a structure diagram showing a tunable external cavity laser diode using a variable optical deflector according to a fifth embodiment of the present invention, in which like reference numerals refer to like elements shown in FIG. 5.

Basically, the tunable external cavity laser diode of FIG. 7 has the same configuration as that of FIG. 5. However, in the tunable external cavity laser diode of FIG. 5, the variable optical deflector 130 is formed in the InP (or GaAs) based slab waveguide 100, and the concave diffraction grating 120 is formed in the silica (or polymer) based slab waveguide 100', while in the present embodiment, the variable optical deflector 130 and the diffraction grating 120 are formed in the silica (or polymer) based slab waveguide 100' and the semiconductor optical amplifier 112 is provided separate from the silica (or polymer) based slab waveguide 100'. At this time, the antireflective thin film 150 is deposited on the semiconductor optical amplifier 112 of the plane interfacing the silica (or polymer) based slab waveguide 100' to minimize the reflectivity, and a cylindrical lens 160 is arranged in the silica (or polymer) based slab waveguide 100' between the semiconductor optical amplifier 112 and the concave diffraction grating 120 to enhance the optical coupling efficiency.

Figure 8:
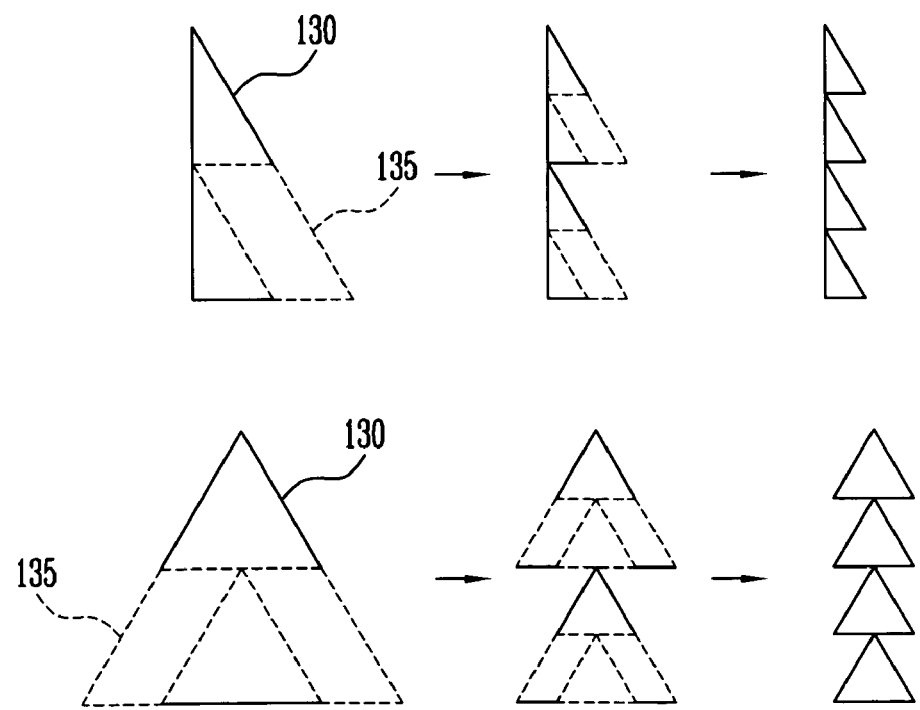
FIG. 8 is a structure diagram illustrating a variable optical deflector applied to the present invention, for optimizing operating power thereof.

FIG. 8 is a structure diagram illustrating a variable optical deflector applied to the present invention, for optimizing operating power thereof. When an area of a p/n junction having a triangular shape constituting the variable optical deflector 130 is reduced without changing an incident angle and an exit angle, there is an effect that the electric energy may be reduced while maintaining the change of angle to be constant. A portion 135 of the slab waveguide refers to a portion where the electrical signal is not applied to minimize the operating power.

As described above, in a tunable external cavity laser diode using a variable optical deflector of the present invention, a variable optical deflector having a triangular shape, in which the refractive index varies according to an electrical signal, is added between a concave diffraction grating and a reflective mirror in a Littman-Metcalf external cavity. Since a resonant frequency is changed using the electrical signal rather than mechanical movement, the stable operation and continuous high-speed tunability may be enabled.

When the tunable external cavity laser diode according to the present invention is implemented in an InP/InGaAsP/InP slab waveguide, a variable time determined by the carrier lifetime may be reduced to several nanoseconds or less, the miniaturization is enabled, and the manufacturing costs are significantly reduced due to the process simplification.

In addition, when the diffraction grating applied to the present invention is designed based on the silica (or polymer) based slab waveguide, the fabrication may be performed even by a lithography process having low resolution, thereby enhancing reproducibility and uniformity of the diffraction grating, and accordingly, reducing the manufacturing costs.

While the exemplary embodiments of the present invention have been described with reference to the detailed description and the attached drawings, these embodiments are illustrative only, but not for limiting the scope of the present invention claimed in the following claims. Therefore, those skilled in the art will appreciate that a variety of modifications and the equivalents thereof may be made. Thus, the scope of the present invention should be defined by the appended claims.

What is claimed is:

1. A tunable external cavity laser diode using a variable optical deflector, comprising:
    a semiconductor optical amplifier generating beams having several wavelengths;
    a passive waveguide outputting the beams to be inclined and having a cross section according to a Wadsworth grating system such that diffracted beams propagate in parallel;
    a slab waveguide spreading in parallel the beams outputted from the passive waveguide as well as guiding the beams in a vertically confined manner;
    a concave diffraction grating having a concave light incident plane and diffracting the propagating beams from the slab waveguide to be parallel based on a wavelength;
    a reflective mirror formed on one side of the slab waveguide to reflect the parallel beams diffracted by the concave diffraction grating; and
    a variable optical deflector located between the concave diffraction grating and the reflective mirror, and having refractivity varying according to an electrical signal so that a beam having a specific wavelength among the beams diffracted by the concave diffraction grating is incident perpendicular to the reflective mirror,
    wherein the semiconductor optical amplifier, the diffraction grating, and the variable optical deflector are integrated into the slab waveguide.

2. The tunable external cavity laser diode according to claim 1, wherein the semiconductor optical amplifier, the diffraction grating, the variable optical deflector, and the slab waveguide are made of an InP-based or GaAs-based semiconductor substrate.

3. The tunable external cavity laser diode according to claim 1, wherein the diffraction grating, the variable optical deflector and the slab waveguide are made of a silica-based or polymer-based substrate, and an InP-based or GaAs-based semiconductor optical amplifier is hybridly integrated on the silica-based or polymer-based substrate.

4. The tunable external cavity laser diode according to claim 3, wherein a cylindrical lens is interposed between the silica-based or polymer-based substrate and the semiconductor optical amplifier.

5. The tunable external cavity laser diode according to claim 3, wherein an antireflective thin film is deposited on the silica-based or polymer-based substrate at a portion where the slab waveguide and the semiconductor optical amplifier are in contact with each other.

6. The tunable external cavity laser diode according to claim 1, wherein the variable optical deflector is formed of a p/n junction having a triangular shape at a predetermined portion of the slab waveguide and the electrical signal is applied to the p/n junction.

7. The tunable external cavity laser diode according to claim 1, wherein the semiconductor optical amplifier, the variable optical deflector, and the reflective mirror are formed in an InP-based or GaAs-based slab waveguide, the diffraction grating is formed in a silica-based or polymer-based slab waveguide, and the InP-based or GaAs-based slab waveguide and the silica-based or polymer-based slab waveguide are hybridly integrated.

8. The tunable external cavity laser diode according to claim 7, wherein a cylindrical lens is interposed between the InP-based or GaAs-based slab waveguide and the silica-based or polymer-based slab waveguide for optical coupling.

9. The tunable external cavity laser diode according to claim 7, wherein an antireflective layer is deposited on an interface between the InP-based or GaAs-based slab waveguide and the silica-based or polymer-based slab waveguide to minimize reflectivity.

10. The tunable external cavity laser diode according to claim 7, wherein the variable optical deflector is formed of a p/n junction having a triangular shape at a predetermined portion of the InP-based or GaAs-based slab waveguide, and the electrical signal is applied to the p/n junction.

11. The tunable external cavity laser diode according to claim 1, wherein the variable optical deflectors are arranged in a multi-stage structure to refract the beams at least more than once.

* * * * *